United States Patent [19]
Gersbach et al.

[11] Patent Number: 5,245,637
[45] Date of Patent: Sep. 14, 1993

[54] PHASE AND FREQUENCY ADJUSTABLE DIGITAL PHASE LOCK LOGIC SYSTEM

[75] Inventors: John E. Gersbach, Burlington; Ilya I. Novof, Essex Junction, both of Vt.

[73] Assignee: International Business Machines Corporation, Armonk, N.Y.

[21] Appl. No.: 815,810

[22] Filed: Dec. 30, 1991

[51] Int. Cl.⁵ ............................................. H03D 3/24
[52] U.S. Cl. ................................... 375/119; 328/72; 307/511
[58] Field of Search ................ 307/296; 331/25, 34; 328/72; 375/118, 119, 120

[56] References Cited

U.S. PATENT DOCUMENTS

| | | |
|---|---|---|
| 3,336,534 | 8/1967 | Gluth ..................................... 331/12 |
| 3,358,240 | 12/1967 | McKay .................................. 329/122 |
| 3,484,555 | 12/1969 | Ching et al. ........................... 179/15 |
| 3,810,235 | 5/1974 | Hopkins et al. ................ 340/174.1 B |
| 4,012,598 | 3/1977 | Wiley ................................... 178/69.1 |
| 4,137,505 | 1/1979 | Guanella .............................. 329/124 |
| 4,151,485 | 3/1979 | LaFratta ........................ 375/120 X |
| 4,185,768 | 2/1993 | Ferraido et al. ..................... 375/119 |
| 4,604,582 | 8/1986 | Strenkowski et al. .......... 307/269 X |
| 4,908,842 | 3/1990 | Collins ................................. 375/119 |
| 4,972,444 | 11/1990 | Melrose et al. ................. 375/119 X |
| 4,999,526 | 3/1991 | Dudley ................................ 307/269 |
| 5,101,203 | 3/1992 | Gersbach et al. ................... 341/100 |

Primary Examiner—Curtis Kuntz
Assistant Examiner—Bryan E. Webster
Attorney, Agent, or Firm—Calfee, Halter & Griswold

[57] ABSTRACT

A phase lock logic system is provided for (i) determining differences in phase and frequency of a received composite clock and data signal with respect to a local clock signal and (ii) providing control signals to enable accurate sampling and reconstruction of the received data. The system includes a delay element which outputs a plurality of phase-delayed signals each being incrementally shifted in phase from the local clock signal. A sorting circuit receives the phase-delayed local clock signals and the incoming composite signal, defines a number of time intervals in each cycle of the local clock signal equal to the number of phase-delayed local clock signals, and sorts positive and negative going transitions in the received composite signal into the defined time intervals. Counters indicate the number of transitions occurring during a selected time interval. A logic circuit reads the counters, determines the differences in frequency and phase of the received composite signal with respect to the local clock signal, and outputs first and second control signals. A barrel shifter responsive to the first control signal selects which of the counters counts the number of transitions occurring in a given time interval. A multiplexer responsive to the first and second control signals extracts the phase-delayed local clock signal which most closely approximates the phase and frequency of the received composite signal. A regenerator compares the extracted signal to the received composite signal and outputs regenerated data.

20 Claims, 4 Drawing Sheets

PHASE AND FREQUENCY ADJUSTABLE DIGITAL PHASE LOCK LOGIC SYSTEM

TECHNICAL FIELD

The present invention relates generally to digital data transmission systems and more specifically to a digital phase lock logic system which compensates for changes in both phase and frequency of a received composite clock and data signal.

BACKGROUND OF THE INVENTION

In digital data transmission systems, composite clock and data signals in binary form are transmitted over media such as wires or fiber optic cables from a transmission line transmitter to a transmission line receiver. Data is represented by pulses in the signal stream defined by positive-going and negative-going transitions at particular times. The transmitter outputs the composite signal at a predetermined frequency. Typically, however, the phase of the composite signal of predetermined frequency is subject to phase drift or jitter (a valid transition occurring at a time other than where expected) and noise (an invalid transition).

The transmission line receiver typically includes a regenerative repeater for accurately reconstructing the transmitted data, regardless of phase drift and noise. The transmitted composite signal is thereby repeatedly reconstructed instead of becoming progressively more and more phase-shifted and noisy. In the case of long distance, high capacity digital systems, the accuracy of the regenerative repeaters will often determine the overall effectiveness of the system.

The function of the repeaters is to reconstruct the transmitted composite signal in its original form, ideally without error. Such reconstruction can be achieved by sampling the received signal at a regular rate equal to the transmitted bit rate, and at each sample instant making a decision of the most probable symbol being transmitted. Typically, a threshold level is chosen to which the received signal is compared. Above this threshold level a binary one is registered, and below the threshold a binary zero is registered.

The regenerator circuit makes these zero or one decisions, based on clocking information provided by a phase locked loop (PLL), at sampling times during which positive-going and negative-going transitions do not occur. By sampling at these selected times, the odds of accurately reconstructing the transmitted binary bits in the signal are increased, and hence the bit error rate (BER) of the ultimately reconstructed data signal is improved.

Phase locked loops in regenerator circuits provide a local clock signal at which the transmitted signal is sampled during reconstruction. Phase lock loops may be implemented in either analog or digital form. Digital phase lock loops (DPLLs) alleviate some of the problems associated with analog PLLs; namely, sensitivity to noise, difficulties encountered in constructing higher order loops, and, depending on the system, the need for initial calibration and periodic adjustments.

Known digital phase lock loops include a local oscillator for outputting a local clock signal which is compared to the received composite signal to indicate the phase difference between the local clock and the received composite signal. One such digital phase lock logic circuit is described by E. A. Zurfluh in U.S. Pat. No. 4,677,648, entitled "Digital Phase Locked Loop Synchronizer," assigned to the same assignee as the present invention and incorporated by reference herein. According to the '648 patent, a local oscillator clock signal of a given frequency is furnished to a digital delay chain which is used to both determine the phase offset between an incoming signal and a locally generated clock signal and to obtain a phase selected signal. Evaluation means, upon occurrence of a digital transition, obtains bi-level tap signal values as a phase offset indication and generates an appropriate phase selection signal which selects one of the delay line tap signals as the output clock signal. Although somewhat successful under jitter conditions, the Zurfluh technique experiences difficulty in differentiating between noise and valid data transitions, especially in a high noise environment.

The local clock signal and the received composite signal often differ in frequency, as well as phase, because each of these two signals is produced by a separate oscillator. Although the separate oscillators may be chosen and/or tuned to output clock signals of nearly identical frequency, in high speed data applications, even a small differential in frequency may result in sampling times which do not optimize reconstruction of the originally transmitted data. The resultant reconstruction may cause an unacceptable increase in the bit error rate in the regenerated data signal. Accordingly, it is believed that there is a need for providing a digital phase lock logic system which compensates for differences in both phase and frequency of a transmitted composite signal with respect to a locally generated clock signal.

It is an object of the present invention, therefore, to provide a high-speed, low-power digital phase lock logic system for (i) determining differences in the phase and frequency of a received composite signal with respect to a locally generated clock signal and (ii) extracting timing information from the received composite signal in real time based on the determination of the phase and frequency differences.

SUMMARY OF THE INVENTION

According to the present invention, a phase lock logic system is provided for determining (i) the delay or phase shift of a received composite signal with respect to a local clock signal and (ii) the difference in frequency between the received signal and local clock signals. Based on these determinations, a logic circuit issues control signals to enable accurate sampling and reconstruction of the originally transmitted data. The system is suitable for high speed applications and can be realized in hardware or in hardware/software combination.

The local clock signal operates at a phase and frequency which are slightly mismatched to the phase and frequency of the received composite signal. The local clock signal is divided by a delay element which outputs a plurality n of phase-delayed signals of the same frequency as the local clock signal. The sum of the delays of n phase-delayed signals corresponds to the period of the local clock signal. Each of these delayed signals is thus incrementally shifted in time about 1/n of a local clock signal period.

A data edge sorting circuit receives each of the n phase-delayed local clock signals and establishes n time intervals per local clock signal period. The sorting circuit also receives the incoming composite signal, senses the positive and negative going transitions of pulses in the incoming signal, and sorts these positive and negative going transitions into the n time intervals. The output of the sorting circuit thus provides an indication of the time intervals during which the data transitions occur, and the phase shift of these transitions with respect to corresponding positive and negative going transitions in the local clock signal.

A series of counters counts the number of positive and negative going transitions occurring during the established time intervals into which the local clock signal period is divided and stores this information. The counters associated with each of the n equal time intervals thereby provide a real time history of the time of transitions in the received composite signal. A barrel shifter is utilized to shift the transitions occurring during a particular time interval to an adjacent counter to compensate for the frequency difference between the incoming composite clock and data signal and the local clock signal.

A logic circuit reads the output lines of each of the counters, develops a histogram of the frequency distribution of the counted transitions in the counters, and determines, via the histogram, real time changes in the phase and frequency of the received composite signal with respect to the local clock signal. Based on this determination, the logic circuit issues a first control signal containing frequency difference information to an up/down counter and a second control signal containing phase shift information to a multiplexer. The up/down counter responds to the first control signal to direct the barrel shifter to shift the positive and negative going transitions occurring during a particular time interval to an adjacent counter to compensate for the frequency difference between the received composite signal and the local clock signal. The multiplexer extracts the phase-shifted local clock signal which most accurately represents the present phase shift between the received composite signal and the local clock signal based on (i) the second control signal output by the control logic circuit and (ii) the output of the up/down counter.

The originally transmitted data in the received composite signal is reconstructed by sampling the signal intermediate the positive and negative going transitions occurring therein. Because of the mismatch of phase and frequency between the local clock signal and the received composite signal, positive and negative going transitions in the received composite signal do not occur simultaneously with corresponding transitions in the local clock signal. Thus, the extent to which the received composite signal and the local clock signal differ in phase and frequency must be determined in order to determine the precise times at which this sampling should occur. By comparing the differences in frequency and phase of the received composite signal and the local clock signal, the sampling times may be adjusted on a real time basis.

By determining in real time the frequency and phase of the incoming data signal with respect to the local clock signal, the optimal sampling points of the data signal may be ascertained to ensure accurate regeneration. During real time operation of the system, the control logic circuit simultaneously controls the frequency and direction of rotation of both the barrel shifter and the multiplexer.

The phase-delayed signal extracted and output by the multiplexer is used as a sampling signal and is fed to an edge triggered latch along with the received composite clock and data signal. Upon occurrence of a positive going edge of the sampling signal, the edge triggered latch outputs the received composite signal present on the data line. This output is held until the next positive transition occurring in the sampling signal. The output of the latch thereby provides an accurate reconstruction of the originally transmitted data.

DETAILED DESCRIPTION OF THE PREFERRED EMBODIMENT

Figure 1:
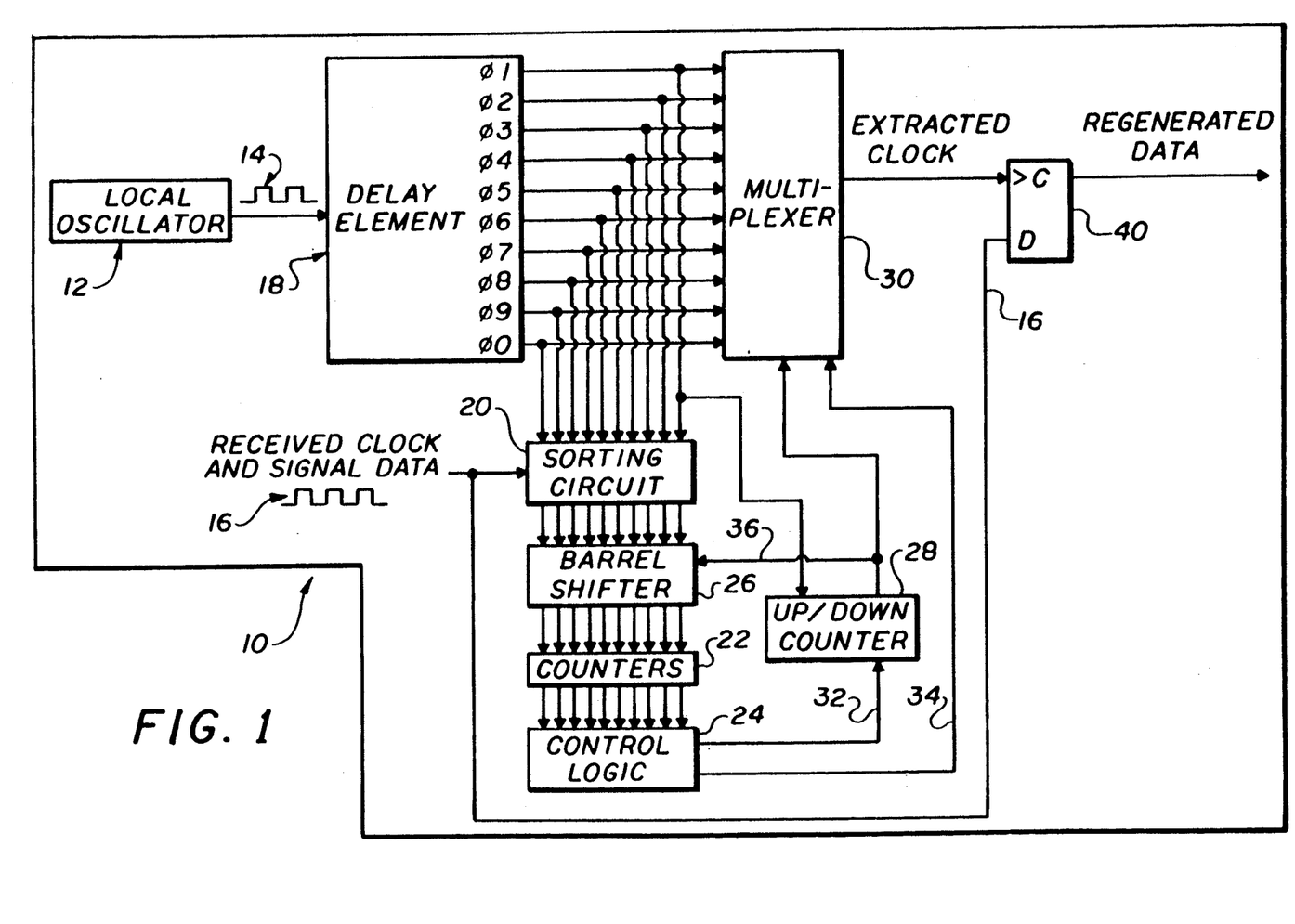
FIG. 1 is a schematic block diagram of a frequency and phase adjustable digital phase lock logic system constructed according to the principles of the present invention.

A block diagram of a digital phase lock logic system is shown generally at 10 in FIG. 1. The system 10 includes a local oscillator 12 which outputs a local clock signal 14 operating at a frequency near that of a received composite clock and data signal 16, a delay element 18 for establishing a plurality of phase-delayed local clock signals, and a data edge sorting circuit 20 for sorting edge transitions in the received composite signal 16 into a number of time intervals corresponding to the number of phase-delayed local clock signals. A series of counters 22 counts the number of these transitions occurring in each of the established time intervals. A logic circuit 24 is provided for reading the counters, examining the histogram of the frequency distribution of the counted transitions in the counters, and determining via the histogram real time changes in the phase and frequency of the received composite signal with respect to the local clock signal. Based on these determinations, the logic circuit 24 issues control signals to enable accurate sampling and reconstruction of the originally transmitted data signal.

The local clock signal 14 output by the local oscillator 12 operates at a phase and frequency which are nearly matched to those of the received composite signal 16. The local clock signal 14 and the received signal 16 are slightly mismatched in frequency because the two signals originate at separate oscillators in different locations. The local clock signal 14 and the received signal 16 are also mismatched with respect to phase because the received signal 16 is subject to phase drift or jitter over time as it passes through the transmission medium.

The local clock signal 14 output by the local oscillator 12 is directed to a delay element 18 which outputs a plurality n of phase-delayed signals of the same frequency as the local clock signal 14. The sum of the delays of n phase-delayed signals corresponds to the period $T_{local}$ of the local clock signal. Each of these delayed signals is shifted in time about 1/n of a local clock signal period. Thus, for a local clock signal period $T_{local}$ and a resolution of 10%, ten phase-shifted signals are output by the delay element 18, each of the signals being shifted successively in time by $T_{local}/10$. These phase-shifted signals are identified as $\phi 0$ through $\phi 9$ in FIGS. 1 and 4. Of course, more or less than ten phase-shifted signals may be implemented, the preferred range of n being an integer between 8 and 20. Generally, the greater the number of phase-delayed signals output by the delay element 18, the greater the phase resolution. As an alternative to the delay element 18, a series of n gates could be used, each having an inherent propagation delay of $T_{local}/n$.

The data edge sorting circuit 20 provides an instantaneous indication of the approximate location in time of a data edge transition relative to the local clock signal 14. The data edge sorting circuit receives each of the n phase-delayed local clock signals and establishes n time intervals per period $T_{local}$ corresponding to these n signals. The leading edge of one time interval occurs precisely at the trailing edge of a previous interval. The sorting circuit 20 also receives the incoming composite signal 16, senses the positive and negative going transitions of pulses in the signal, and sorts the positive and negative going transitions into these n time intervals. The output of the sorting circuit 20 thus provides an indication of the time intervals during which these transitions are occurring, and the phase shift of these transitions with respect to corresponding positive and negative going transitions in the local clock signal 14.

The series of counters 22 comprises counters 22a through 22n, one counter for each time interval established by the sorting circuit 20. Each of the individual counters 22a–n counts the number of positive and negative going transitions occurring during its respective time interval and stores this information by conventional means. A barrel shifter 26 is utilized to shift the transitions occurring during a particular time interval to an adjacent counter to compensate for the frequency difference between the received composite signal 16 and the local clock signal 14, as will be more fully described hereinafter.

Logic circuit 24 extracts one of the phase-delayed local clock signals for use in data retiming based upon an analysis of the historical distribution of a predetermined number of sorted data edge transitions. The logic circuit reads the output lines of each of the counters 22a–n, analyzes the frequency distribution or histogram of this count data, and determines via the histogram real time changes in the phase and frequency of the received composite signal 16 with respect to the local clock signal 14. Based on this determination, the logic circuit 24 issues control signals to an up/down counter 28 and a multiplexer 30.

The logic circuit 24 issues a first control signal 32 containing frequency difference information to the up/-down counter 28 and a second control signal 34 containing phase shift information to the multiplexer 30. The up/down counter 28 responds to the first control signal 32 by outputting an output signal 36 which controls the frequency and the direction of rotation at which the barrel shifter 26 operates. Effectively, the up/down counter 28 directs the barrel shifter 26 to shift the positive and negative going transitions occurring during a particular time interval to an adjacent counter to compensate for the frequency difference between the received composite signal 16 and the local clock signal 14.

The up/down counter 28 needs an input clock frequency in addition to a control signal to operate. To this end, one of the phase-delayed local clock signals is also used to operate the up/down counter 28 in response to the first control signal 32 output by the control logic circuit 24. As shown in FIG. 1, $\phi 1$ is used to operate the up/down counter. Of course, this operating clock signal could be provided by any of the phase-delayed clock signals, or could alternatively be provided by an external source.

The multiplexer 30 extracts the phase-shifted local clock signal which most accurately represents the present phase shift between the received composite signal 16 and the local clock signal 14 based on (i) the second control signal 34 output by the control logic circuit 24 and (ii) the up/down counter output signal 36. The frequency and direction of rotation at which the multiplexer operates is the same as that of the barrel shifter 26.

In addition to the up/down counter output signal 36, the multiplexer needs phase difference information provided by the control logic circuit 24. The multiplexer decodes this phase difference information in a conventional manner using a register or other storage device. The first control signal 32 output by the control logic circuit 24 provides the frequency information to the multiplexer via the up/down counter 28, and the second control signal provides the phase shift information to the multiplexer. The multiplexer thus extracts the phase-shifted local clock signal which most accurately represents the present phase shift between the received composite signal 16 and the local clock signal 14 to compensate for the phase difference. In this manner, the device 10 permits accurate sampling and reconstruction of the originally transmitted data signal by eliminating the frequency and phase mismatch between the received composite signal 16 and the local clock signal 14.

Figure 2:
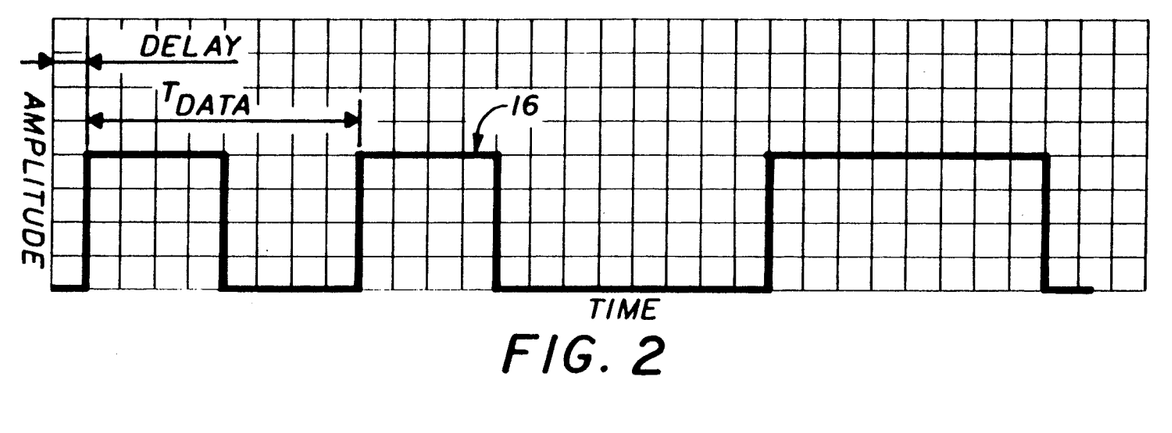
FIG. 2 is a graph of a sample composite clock and data signal received by the digital phase lock logic system of FIG. 1.
Figure 3:
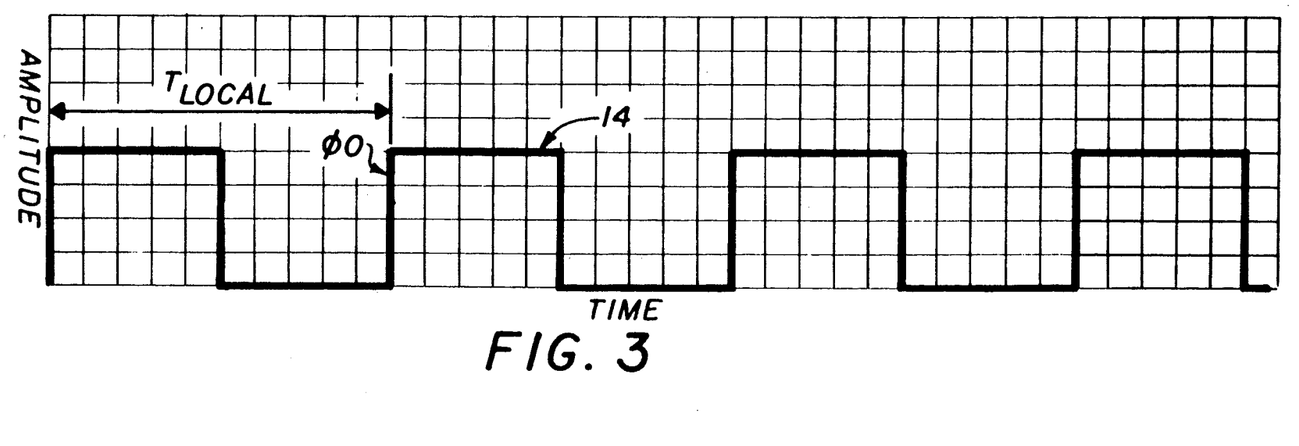
FIG. 3 is a graph of a local clock signal generated by the system of FIG. 1.
Figure 4A:
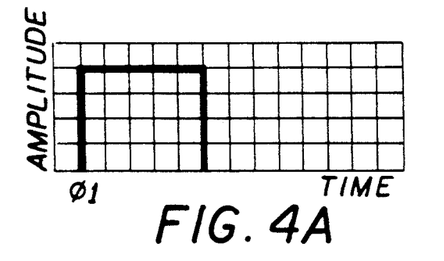
FIG. 4 is a graph of a series of delayed local clock signals generated by the system of FIG. 1.
Figure 4B:
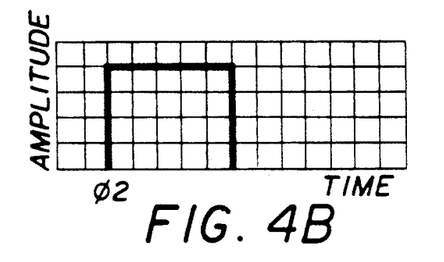
Figure 4C:
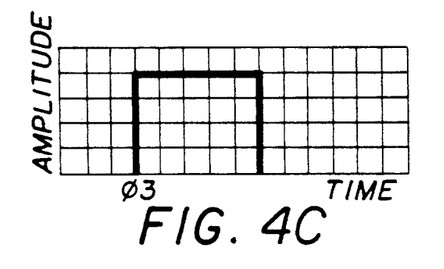
Figure 4D:
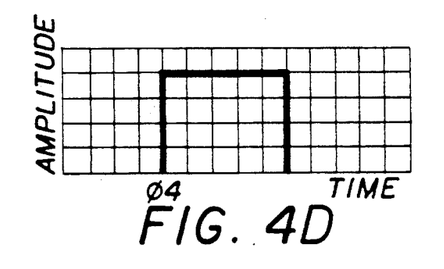
Figure 4E:
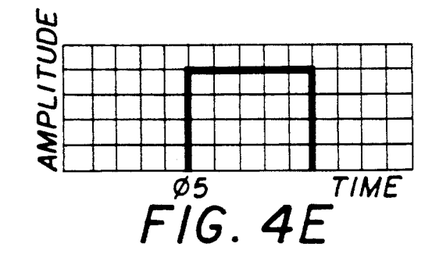
Figure 4F:
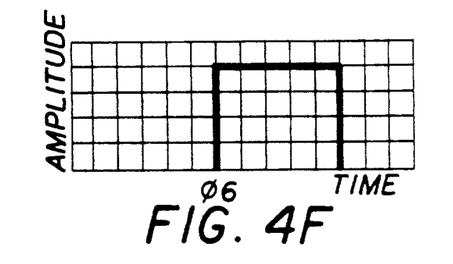
Figure 4G:
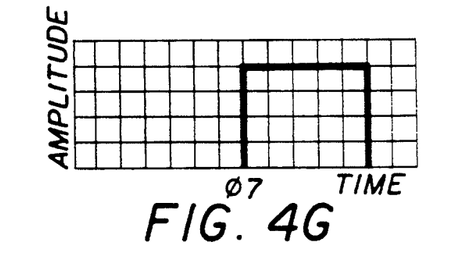
Figure 4H:
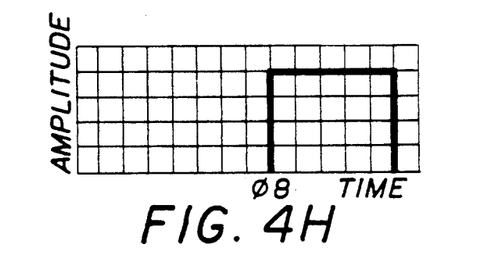
Figure 4I:
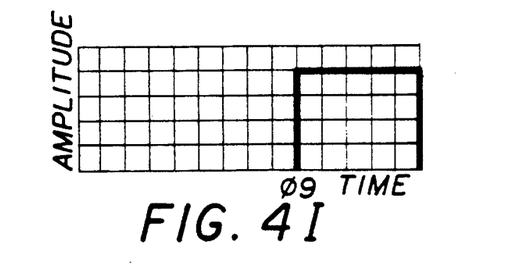

FIGS. 2 through 4 illustrate the differences in phase and frequency between the received composite signal 16 and the local clock signal 14 which occur during operation of the device 10. As shown in FIG. 2, the received composite signal 16 is shown ideally as a digital waveform which represents binary data and which is carried by a clock signal generated at a remote data transmitter (not shown). The data is transmitted in bit intervals of period $T_{data}$. The sequence of voltage levels of the waveform during a given bit interval determines whether a binary "one" or "zero" is being transmitted. A signal which is HIGH for the first half of the bit interval and LOW for the second half of the bit interval represents a binary "1", and a signal which is LOW for the first half of the bit interval and HIGH for the second half of the bit interval represents a binary "0". Thus, as shown in FIG. 2, a binary data string of 1-1-0-1 is being transmitted.

FIG. 3 represents the local clock signal 14 output by the local oscillator 12. As can be seen by a comparison of FIGS. 2 and 3, the frequencies of local clock signal 14 and the received composite signal 16 are slightly mismatched. This mismatch of frequencies results from the fact that these two signals are generated by different oscillators at different locations. As shown in the particular example of FIG. 3, the local clock frequency is slightly lower than that of the data clock. However, the local clock frequency could be slightly higher than that of the data clock. In either case, the principles of the present invention may be applied to compensate for this frequency difference.

In addition to frequency differences, the received composite signal 16 may be shifted in phase with respect to the local clock signal 14. This phase difference results from the drift that the received composite signal experiences during real time transmission over the transmission medium. Because of the mismatch of phase and frequency between the local clock signal and the received composite signal, positive and negative going transitions in the received composite signal do not occur simultaneously with corresponding transitions in the local clock signal.

The originally transmitted form of the received composite signal is reconstructed by sampling the signal intermediate the positive and negative going transitions occurring therein. Typically, this is done by sampling the received composite signal precisely at the midpoint of all positive and negative going transitions. The extent to which the received composite signal and the local clock signal differ in phase and frequency must thereby be determined in order to determine the precise times at which this sampling should occur. Thus, in order to determine the proper sampling time, one must first determine the precise times at which transitions occur in the received composite signal 16 with respect to a reference time frame such as the local clock signal 14. By comparing the differences in frequency and phase of the received composite signal and the local clock signal, the sampling times may be adjusted on a real time basis to enable continuous and accurate reconstruction of the originally transmitted signal.

The phase-delayed signals output by the delay element 18 and having the same frequency as the local clock signal 14 are provided to implement the sampling technique described above. These phase-shifted signals are identified as $\phi 0$ through $\phi 9$ in FIGS. 1 and 4. Each of the delayed waveforms is of the same amplitude and frequency as the local clock signal 14 but is incrementally delayed in time with respect thereto. In the particular example illustrated in Figure 1, ten delayed waveforms are provided. This number, however, may vary depending on the desired accuracy of the system. The first signal $\phi 1$ is delayed by 1/10 the period $T_{local}$ of the local clock signal and each successive delayed signal is shifted in time with respect to the immediately preceding signal by $T_{local}/10$. Thus, $\phi 9$ is delayed by 9/10 of the period $T_{local}$ of the local clock signal. $\phi 0$ is delayed by an entire period $T_{local}$ and is in fact precisely in phase with the local clock signal 14. The positive going transitions in each of the phase-delayed signals thereby divide the period $T_{local}$ into ten equal time intervals.

Because the bit interval of the received composite signal is approximately the same as the local time clock period $T_{local}$, these ten time intervals establish ten periods in which a HIGH-LOW or LOW-HIGH transition may occur in the received composite signal. In practice, the period $T_{local}$ is configured to be slightly greater than $T_{data}$ to guarantee that each data transition will be detected and sorted into one of the n time intervals. Also, as described further below, because the local clock period is slightly greater than the data clock period, two of the time interval counters 22a-n will initially (and thereafter periodically) accumulate counts at a faster rate than the remaining counters, even under a high jitter or high noise condition. This information may be used to select an appropriate phase-delayed local clock signal.

If the local clock signal 14 and the received composite signal were of identical frequency and in phase with each other, HIGH-LOW and LOW-HIGH transitions in the received composite signal could occur only at the positive going transitions of $\phi 0$ and $\phi 5$, i.e., the exact beginning and middle of each bit interval. In such an ideal case, sampling the received composite signal would be easily accomplished by sampling only between the positive going transitions of $\phi 2$ and $\phi 3$ (halfway through the first half of the bit interval) or between $\phi 7$ and $\phi 8$ (halfway through the second half of the bit interval). Such a sampling technique would minimize the number of errors in the reconstructed data signal because the sampling would occur at the locations in the bit interval where transitions were least likely to occur.

As may be seen in FIGS. 2–4, the local clock signal and the received composite signal are not synchronized in phase nor are they of identical frequency. Thus, instead of the positive and negative going transitions of the received composite signal occurring only at the positive going transitions of $\phi 0$ and $\phi 5$, the data transitions of FIG. 2 occur at the positive going transitions of $\phi 1$, $\phi 5$, $\phi 9$, $\phi 3$, $\phi 1$, and $\phi 9$. Thus, the particular counters 22 associated with each of the ten equal time intervals into which $T_{local}$ is divided provide the control logic circuit with the real time history of the time of transitions in the received composite signal to enable development of a continuous histogram of the transition frequency distribution.

The counters 22a–22n associated with the time intervals in the particular sequence shown in FIG. 2 indicates that the data transitions occur either 4 n or 8 n apart, and, hence allows a determination of the frequency of the data signal with respect to the local clock signal. Thus, the period of the $T_{local}$ is determined to be 8n. Further, the sequence of data transitions obtained indicates that the data signal lags the clock signal by T/n. By determining in real time the frequency and phase of the data signal with respect to the local clock signal, the optimal sampling points of the data signal may be ascertained. These optimal sampling points vary over real time, and thus the control logic is designed to determine the optimal sampling points based on changing operating conditions. Typically, at least two of the counters associated with the time intervals will experience relatively high counts, and the remaining counters will experience lower counts. If the two counters with the highest transition counts are identified, the sampling points may be selected precisely between these two transition points to ensure accurate regeneration.

The barrel shifter 26 and the multiplexer 30 operate in the same direction and at the same frequency S. The frequency S depends on the local clock frequency ($\phi 1$) and the count value M of the up/down counter 28 as follows: $S = \phi 1/M$. By controlling the value of M, the control logic circuit may effectively control the frequency of operation of both the barrel shifter and the multiplexer. The frequency S is changed in discrete steps $\Delta S$ by changing the count value M with the first control signal 32. The minimum increment of the count value M is one and hence: $\Delta S = \phi 1[(1/M) - (1/(M+1))]$. The polarity of $\Delta S$ determines the direction of rotation of both the barrel shifter and the multiplexer.

Figure 5:
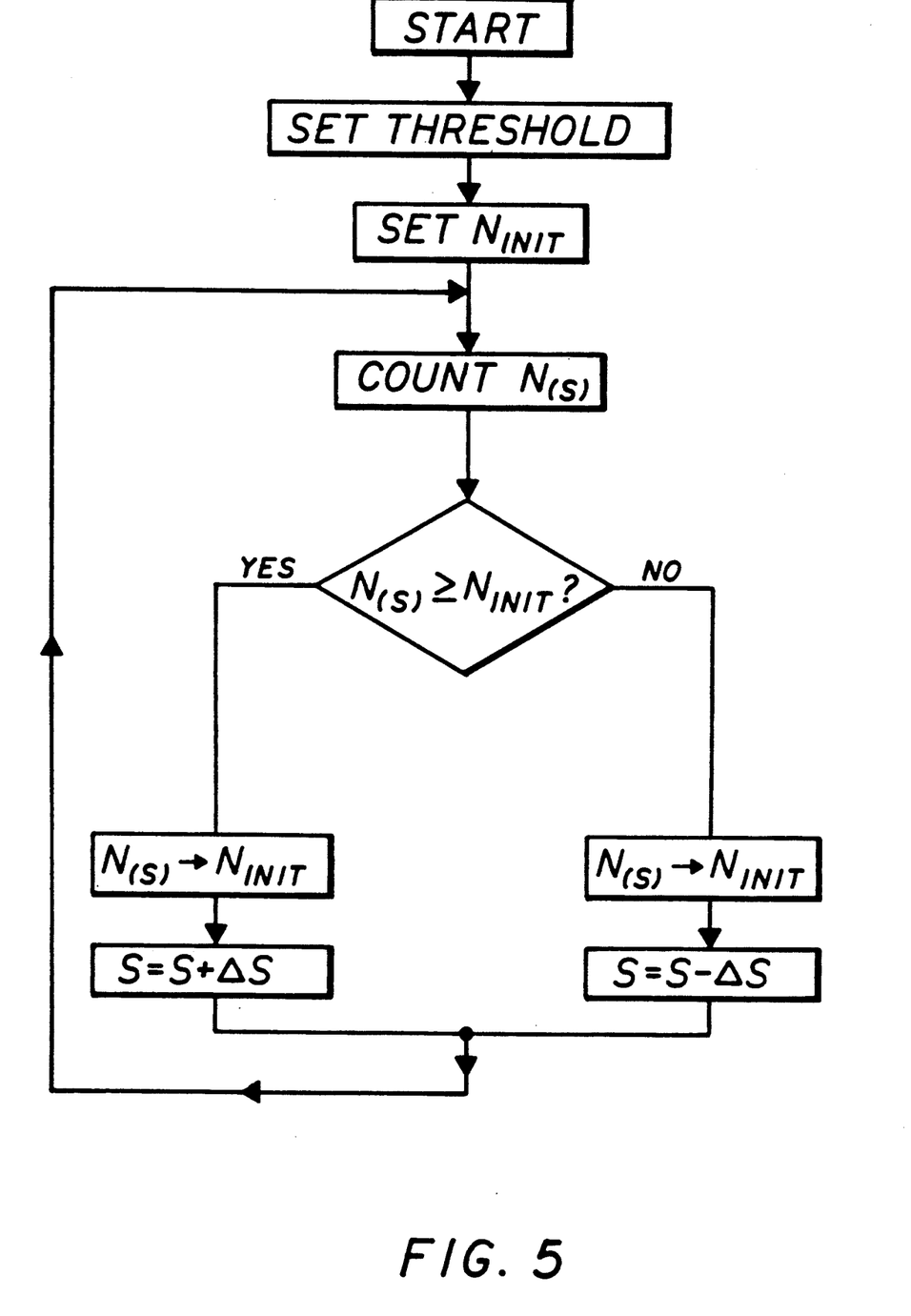
FIG. 5 is a flow chart of the control logic used in the digital phase lock logic system of FIG. 1.

FIG. 5 is a flow chart representing one embodiment of control logic 24, which may be implemented in either hardware or a hardware/software combination. At start up of the system 10, the barrel shifter 26 and the multiplexer 30 are set at predetermined operating frequencies and directions of rotation. Also at start up, a threshold counter value init is selected. During real time operation, any counters with a transition count below init will be deemed to have a "zero count". Next, a number $N_{init}$ is selected to define the number of counters having a transition count below init. After a sufficient number of data transitions have passed (e.g. 1000 bit intervals), the control logic circuit 24 analyzes the histogram, or frequency distribution, of the transitions by reading the counters 22a –n to arrive at a number N(S) of counters having a "zero count".

The number N(S) is compared with the number $N_{init}$. If N(S) is greater than or equal to $N_{init}$, more of the counters 22a-22n are registering "zero counts" and hence the data transitions are occurring with greater frequency in at least two of the n time intervals. By selecting sampling points between these two intervals, the data may be more accurately regenerated. Accordingly, under such conditions, the present value of N(S) is assigned to $N_{init}$ and the direction of rotation of the barrel shifter and the multiplexer (i.e. the polarity of S) is considered to be correct. The frequency S is thus increased by $\Delta S$.

On the other hand, if N(S) is less than $N_{init}$, the present value of N(S) is assigned to $N_{init}$ and the direction of rotation of the barrel shifter and the multiplexer are deemed to be incorrect and are thereby reversed. The frequency S is decreased by $\Delta S$. The data edge transition histogram is reexamined by the control logic circuit 24 at predetermined intervals, such as every 1000 data bit intervals (periods), and a new retiming phase-delayed local clock signal is selected. In this manner, continuous control of the direction of rotation of the barrel shifter and multiplexer is accomplished.

Various mathematical techniques exist for dealing with a grouped sample statistic which can be used to identify the best retiming phase-delayed local clock signal. For example, see W. Cramer, *Mathematical Methods and Statistics*, published by the University of Stockholm, 1946, and the references cited therein. Again the object is to select a time interval where a relative minimum number of the counted data edge transitions have occurred. In this regard, at least one of the counters 22a–n should be below a predefined lower threshold count level to ensure that the selected retiming signal will not interfere with future data transitions of the received composite signal. One technique for extracting the appropriate phase-delayed local clock signal is to split the difference between the two closest time interval counters with counts above a predetermined upper threshold. Alternatively, if only one time interval counter is above the upper threshold, then one-half a local clock period could be added to the one counter to identify a preferred retiming signal. In practice, the resultant histogram should also be evaluated to detect any unexpected count buildups of the time interval counter values.

As shown in FIG. 1, the extracted clock signal appears on the output of the multiplexer 30. The multiplexer output may then be fed to any number of known regenerator elements. In FIG. 1, an edge triggered latch 40 is used as the regenerator element and receives both the extracted clock signal and the received composite signal 16. The extracted clock signal is fed into the clock input "C" of edge triggered latch 40 and is used as the sampling signal for the received composite signal which is fed into the data input "D" of the latch. Data is latched upon either the positive or negative-going transitions of the clock input. Upon the occurrence of a either a positive or negative-going edge of the sampling signal, the edge triggered latch outputs the signal present on the incoming clock and data line. This output is held until the next similar transition of the sampling signal. Thus, the output of latch 40 is an accurate reconstruction of the originally transmitted signal.

Accordingly, the preferred embodiment of a digital phase lock logic system has been described. With the foregoing description in mind, however, it is understood that this description is made only by way of example, that the invention is not limited to the particular embodiments described herein, and that various rearrangements, modifications and substitutions may be implemented without departing from the true spirit of the invention as hereinafter claimed.

We claim:

1. A phase lock logic system comprising:
    a local oscillator which outputs a local clock signal of a predetermined frequency;
    a delay element coupled electrically in series with said local oscillator, said delay element outputting a plurality of delayed clock signals each oscillating at the same frequency as that of said local clock signal, each of said delayed clock signals being incrementally shifted in phase from said local clock signal by a distinct time period;
    a sorting circuit for receiving (i) each of said plurality of delayed clock signals and (ii) a received signal from an external source having pulses defined by positive-going and negative-going transitions, said sorting circuit defining a number of time intervals in each cycle of said local clock signal equal to the number of said plurality of delayed clock signals, said sorting circuit being responsive to said received signal to sort said positive-going and negative-going transitions into the time intervals during which said transitions occur;
    a plurality of counters each of which counts a plurality of said transitions occurring in a selected time interval;
    a logic circuit electrically coupled to and responsive to said counters for (i) determining in real time a difference in frequency and a difference in phase of said received signal with respect to said local clock signal and (ii) outputting individual frequency and phase control signals in response to said difference in frequency and said difference in phase;
    a barrel shifting device electrically coupled to and intermediate said plurality of counters and said sorting circuit and being responsive to said frequency control signal to select which of said plurality of counters counts the plurality of said transitions occurring in one of said time intervals; and
    a multiplexer electrically coupled to said delay element and being responsive to said phase control signal to extract the delayed clock signal which most closely approximates the phase and frequency of the received signal.

2. The system of claim 1, further comprising an output device for comparing said extracted delayed clock signal to said received signal and outputting a regenerated data signal.

3. The system of claim 2, wherein said output device is an edge-triggered latch.

4. A phase lock logic system comprising:
    a local oscillator which outputs a local clock signal of a predetermined frequency;
    a delay element coupled electrically in series with said local oscillator, said delay element outputting a plurality of delayed clock signals each oscillating at the same frequency as that of said local clock signal, each of said delayed clock signals being incrementally shifted in phase from said local clock signal by a distinct time period;

a sorting circuit for receiving (i) each of said plurality of delayed clock signals and (ii) a received signal from an externalsource having pulses defined by positive-going and negative-going transitions, said sorting circuit defining a number of time intervals in each cycle of said local clock signal equal to the number of said plurality of delayed clock signals, said sorting circuit being responsive to said received signal to sort said positive-going and negative-going transitions into the time intervals during which said transitions occur;

a plurality of counters each of which counts a number of said transitions occurring in a selected time interval;

a logic circuit electrically coupled to and responsive to said counters for (i) determining in real time differences in the frequency and phase of said received signal with respect to said local clock signal and (ii) outputting frequency and phase control signals in response thereto;

a barrel shifting device electrically coupled to and intermediate said plurality of counters and said sorting circuit and being responsive to said frequency control signal to select which of said plurality of counters counts the number of said transitions occurring in one of said time intervals;

a multiplexer electrically coupled to said delay element and being responsive to said phase control signal to extract the delayed clock signal which most closely approximates the phase and frequency of the received signal; and a counter for receiving said frequency control signal from said logic circuit and for providing an output signal which controls a frequency and direction of rotation of said barrel shifter and said multiplexer.

5. The system of claim 4, wherein a clock frequency at which said counter operates is provided by one of said delayed clock signals.

6. The system of claim 4, wherein said logic circuit provides said phase control signal directly to said multiplexer.

7. The system of claim 6, wherein said frequency control signal contains information relating to the difference in frequency between said local clock signal and said received signal, and wherein said phase control signal contains information relating to the difference in phase between said local clock signal and said received signal.

8. The system of claim 4, wherein said frequency of said local clock signal defines a period T, wherein said delay element outputs a plurality n of delayed clock signals, and wherein each of said delayed clock signals is successively phase-shifted in time from said local clock signal by T/n.

9. The system of claim 8, wherein n is an integer between 8 and 20.

10. The system of claim 4, wherein said logic circuit reads count values of said plurality of counters at predetermined intervals, analyzes the frequency distribution history of counts in said counters, and outputs said control signals in response thereto.

11. A method of outputting a regenerated data signal comprising the steps of:

providing a local clock signal of a predetermined frequency;

providing a plurality of delayed clock signals each oscillating at the same frequency as that of said local clock signal, each of said delayed clock signals being incrementally shifted in phase from said local clock signal by a distinct time period;

dividing each cycle of said local clock signal into a plurality of time intervals;

sorting positive-going and negative-going transitions of pulses in a received signal into the time intervals during which said transitions occur;

counting a plurality of said transitions occurring in each selected time interval with a plurality of counters;

determining with a logic circuit a difference in frequency and a difference in phase of said received signal with respect to said local clock signal and outputting individual frequency and phase control signals in response to said difference in frequency and said difference in phases;

selecting in response to frequency control signals which of said plurality of counters counts the plurality of said transitions occurring in said selected time interval; and extracting in response to said phase control signal the delayed clock signal which most closely approximates the phase and frequency of the received signal.

12. The method of claim 11, further comprising the additional steps of comparing said extracted delayed clock signal to said received signal and outputting a regenerated data signal.

13. The method of claim 12, wherein said comparison is made with an edge-triggered latch.

14. A method of outputting a regenerated data signal comprising the steps of:

providing a local clock signal of a predetermined frequency;

providing a plurality of delayed clock signals each oscillating at the same frequency as that of said local clock signal, each of said delayed clock signals being incrementally shifted in phase from said local clock signal by a distinct time period;

dividing each cycle of said local clock signal into a plurality of time intervals;

sorting positive-going and negative-going transitions of pulses in a received signal into the time intervals during which said transitions occur;

counting the number of said transitions occurring in each selected time interval with a plurality of counters;

determining with a logic circuit real time differences in the frequency and phase of said received signal with respect to said local clock signal and outputting frequency and phase control signals in response thereto;

selecting in response to said frequency control signals which of said plurality of counters counts the number of said transitions occurring in said selected time interval;

extracting in response to said phase control signal the delayed clock signal which most closely approximates the phase and frequency of the received signal; and providing a counter for receiving said frequency control signal from said logic circuit and for providing an output signal which controls (i) the selection of which of said plurality of counters counts the number of said transitions occurring in said selected time interval and (ii) the extraction of the delayed clock signal which most closely approximates the phase and frequency of the received signal.

15. The system of claim 14, further comprising the step of providing a clock frequency at which said counter operates with one of said delayed clock signals.

16. The system of claim 14, further comprising the step of providing with said logic circuit a second control signal.

17. The system of claim 16, wherein said first control signal contains information relating to the difference in frequency between said local clock signal and said received signal, and wherein said second control signal contains information relating to the difference in phase between said local clock signal and said received signal.

18. The system of claim 14, wherein said frequency of said local clock signal defines a period T, wherein said step of providing a plurality of delayed clock signals includes providing a plurality n of delayed clock signals, and wherein each of said delayed clock signals is successively phase-shifted in time from said local clock signal by T/n.

19. The system of claim 18, wherein n is an integer between 8 and 20.

20. The system of claim 14, further comprising the steps of reading count values of said plurality of counters at predetermined intervals, analyzing the frequency distribution history of counts in said counters, and outputting said control signals in response thereto.

* * * * *